(12) United States Patent
Jiang et al.

(10) Patent No.: US 11,183,520 B2
(45) Date of Patent: Nov. 23, 2021

(54) DISPLAY PANEL WITH INSULATING STRIPES IN NON-DISPLAY AREA AND METHOD OF FABRICATING THEREOF

(71) Applicant: WUHAN CHINA STAR OPTOELECTRONICS TECHNOLOGY CO., LTD., Wuhan (CN)

(72) Inventors: He Jiang, Wuhan (CN); Kotaro Yoneda, Wuhan (CN)

(*) Notice: Subject to any disclaimer, the term of this patent is extended or adjusted under 35 U.S.C. 154(b) by 219 days.

(21) Appl. No.: 16/612,771

(22) PCT Filed: Oct. 11, 2019

(86) PCT No.: PCT/CN2019/110549
§ 371 (c)(1),
(2) Date: Nov. 12, 2019

(87) PCT Pub. No.: WO2021/000442
PCT Pub. Date: Jan. 7, 2021

(65) Prior Publication Data
US 2021/0005640 A1 Jan. 7, 2021

(30) Foreign Application Priority Data
Jul. 4, 2019 (CN) .......................... 201910599923.6

(51) Int. Cl.
*H01L 27/12* (2006.01)
(52) U.S. Cl.
CPC ........ *H01L 27/1248* (2013.01); *H01L 27/124* (2013.01); *H01L 27/1292* (2013.01)

(58) Field of Classification Search
CPC .............. H01L 27/124; H01L 27/1248; H01L 27/1214–13; H01L 27/32–3297
See application file for complete search history.

(56) References Cited

U.S. PATENT DOCUMENTS

| 8,421,352 B2 | 4/2013 | Yamazaki et al. |
| 2003/0017655 A1 | 1/2003 | Lai et al. |
| 2017/0170248 A1* | 6/2017 | Sato ...................... H01L 27/322 |

FOREIGN PATENT DOCUMENTS

| CN | 104765171 A | 7/2015 |
| CN | 107068727 A | 8/2017 |
| CN | 108493200 A | 9/2018 |
| CN | 108761932 A | 11/2018 |
| CN | 109828399 A | 5/2019 |

* cited by examiner

*Primary Examiner* — Suberr L Chi

(57) ABSTRACT

The present application provides a display panel and a method of fabricating the same. The display panel includes a display area, a non-display area, and a channel. The non-display area includes a first insulating layer, a second insulating layer, a first conductive layer, and a third insulating layer. The surface of the second insulating layer has a plurality of convex portions and a plurality of concave portions that are continuously distributed. The first conductive layer covers the second insulating layer. The third insulating layer includes a plurality of insulating strips spaced apart on the first conductive layer, and the plurality of insulating strips are disposed corresponding to the plurality of concave portions.

19 Claims, 2 Drawing Sheets

DISPLAY PANEL WITH INSULATING STRIPES IN NON-DISPLAY AREA AND METHOD OF FABRICATING THEREOF

CROSS REFERENCE TO RELATED APPLICATION

This application is a National Phase of PCT Patent Application No. PCT/CN2019/110549, filed on 2019 Oct. 11, which claims priority to Chinese Application No. 201910599923.6, filed on 2019 Jul. 4. The entire disclosures of each of the above applications are incorporated herein by reference.

BACKGROUND OF INVENTION

Field of Invention

The present invention relates to the field of electronic display, and in particular, to a display panel and a method of fabricating thereof.

Description of Prior Art

In order to increase screen ratio of display panels, a width of a frame of a display panel is repeatedly reduced, so that processes at the frame region of the display panel have higher and higher processing precision. For example, in the production of a thin film transistor layer, it is necessary to apply polyimide to achieve electrical insulation between a display area and a non-display area. Therefore, the polyimide should not cover a conductive layer located in the non-display area while covering the conductive layer of the display area.

Technical Problems

Referring to FIG. 1, because printing precision of the polyimide cannot be accurately controlled, the polyimide is easily expanded to cover the conductive film located in the non-display area. As a result, silver dots cannot be electrically connected to the non-display area, causing the display panel to work abnormally. Therefore, it is necessary to improve the existing technology.

SUMMARY OF INVENTION

The present application provides a display panel and a fabricating method thereof to solve the technical problem that the silver dots cannot be electrically connected to the non-display area.

In order to solve the above problems, the present application provides a display panel comprising a display area, a non-display area, and a channel separating the display area and the non-display area, wherein the non-display area comprises:

a first insulating layer;

a second insulating layer covering the first insulating layer, wherein a surface of the second insulating layer has a plurality of convex portions and a plurality of concave portions that are continuously distributed, the convex portions and concave portions are alternately disposed;

a first conductive layer covering the second insulating layer, the first conductive layer having a uniform thickness; and a third insulating layer comprising a plurality of insulating strips separating from each other on the first conductive layer, wherein the insulating strips are disposed corresponding to the concave portions.

According to an aspect of the application, the display panel further comprising a plurality of silver dots separately distributed in the channel;

wherein tops of the silver dots overflow the channel and extend to cover the first conductive layer of the non-display area.

According to an aspect of the application, wherein a projection of each concave portion on a light-emitting surface of the display panel covers a projection of the insulating strip corresponding to the concave portion on the light-emitting surface of the display panel.

According to an aspect of the application, wherein a side wall of any one of the convex portions and a side wall of the concave portion corresponding to the convex portion are smoothly connected.

According to an aspect of the application, wherein the convex portions have same shape and size, and the concave portions have same shape and size.

According to an aspect of the application, wherein a distance between a highest point of the convex portions and a lowest point of the concave portions is greater than or equal to five times a thickness of the insulating strip.

According to an aspect of the application, wherein tops of the convex portions are smooth curved surfaces.

According to an aspect of the application, wherein material of the third insulating layer is polyimide; and wherein the polyimide has a curing concentration of less than 6.5% and a viscosity of less than 35%.

According to an aspect of the application, the display panel further comprising a thin film transistor layer comprising a first region and a second region surrounding the first region;

wherein the display area is disposed on the first region, the non-display area is disposed on the second region, and the channel is disposed on a boundary of the first region and the second region.

The present application further provides a method of fabricating a display panel, wherein the method comprises the steps of:

providing a thin film transistor layer having a first region and a second region surrounding the first region;

forming a first insulating layer covering the first region and a passivation layer covering the second region, and providing a channel between the first insulating layer and the passivation layer;

forming a second insulating layer covering the first insulating layer and a planarization layer covering the passivation layer, wherein a surface of the second insulating layer has a plurality of convex portions and a plurality of concave portions continuously distributed, and the convex portions and the concave portions are alternately disposed;

forming a first conductive layer covering the second insulating layer and a second conductive layer covering the planarization layer, the first conductive layer having a uniform thickness; and forming a third insulating layer and a fourth insulating layer, wherein the third insulating layer comprises a plurality of insulating strips separating from each other on the first conductive layer, and the insulating strips are disposed corresponding to the concave portions, and the fourth insulating layer covers the second conductive layer.

According to an aspect of the application, wherein the method of forming the second insulating layer covering the first insulating layer and the planarization layer covering the passivation layer comprises:

forming an insulating dielectric layer covering the first insulating layer, the channel, and the passivation layer;

forming a photoresist covering the insulating dielectric layer;

developing the photoresist using a mask; and transferring a pattern of the photoresist onto the insulating dielectric layer;

wherein the mask comprises a first pattern corresponding to the planarization layer, a second pattern corresponding to the channel, and a third pattern corresponding to the second insulating layer;

wherein a region of the mask corresponding to the third pattern is a halftone mask, an image corresponding to the plurality of concave portions in the halftone mask has a first light transmittance, an image corresponding to the convex portions has a second light transmittance, and the first light transmittance is greater than the second light transmittance.

According to an aspect of the application, wherein the method of forming the third insulating layer and the fourth insulating layer comprises:

providing polyimide covering the first conductive layer and the second conductive layer, the polyimide having fluidity;

positioning the display panel to collect the polyimide on the first conductive layer into the concave portions;

curing the polyimide to form a plurality of insulating stripes at a bottom of the concave portions and a fourth insulating layer covering the second conductive layer.

According to an aspect of the application, wherein the polyimide has a curing concentration of less than 6.5% and a viscosity of less than 35%.

According to an aspect of the application, wherein a projection of each concave portion on a light-emitting surface of the display panel covers a projection of the insulating strip corresponding to the concave portion on the light-emitting surface of the display panel.

According to an aspect of the application, wherein a side wall of any one of the convex portions and a side wall of the concave portion corresponding to the convex portion are smoothly connected.

According to an aspect of the application, wherein the convex portions have same shape and size, and the concave portions have same shape and size.

According to an aspect of the application, wherein a distance between a highest point of the convex portions and a lowest point of the concave portions is greater than or equal to five times a thickness of the insulating strip.

According to an aspect of the application, wherein tops of the convex portions are smooth curved surfaces.

According to an aspect of the application, wherein after the third insulating layer and the fourth insulating layer are formed, the method further comprises:

forming a plurality of silver dots separately distributed in the channel;

wherein tops of the silver dots overflow the channel and extend to cover the first conductive layer of the non-display area.

Beneficial Effects

Compared with the non-display area with a flat surface in the prior art, the non-display area of the display panel provided by the present application has a plurality of convex portions and a plurality of concave portions continuously distributed. The convex portions and concave portions are alternately disposed. Therefore, the present application can define a third insulating layer covering the first conductive layer of the non-display area in the concave portions and exposing the first conductive layer outside the third insulating layer, so that electrical connection between the first conductive layer and the silver dots can be achieved. The present application solves the technical problem that the silver dots cannot be electrically connected to the non-display area in the prior art.

DETAILED DESCRIPTION OF PREFERRED EMBODIMENTS

Figure 1:
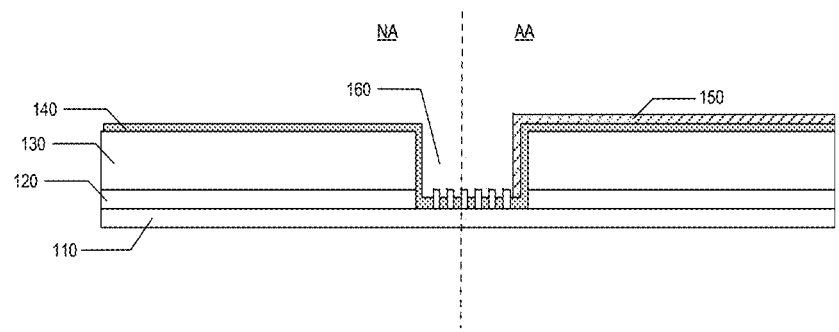
FIG. 1 is a partial cross-sectional view of an ideal display panel.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

First, the prior art will be briefly described. Referring to FIG. 1, FIG. 1 is a partial cross-sectional view of an ideal display panel. The display panel includes a thin film transistor layer 110, a passivation layer 120, a planarization layer 130, a conductive layer 140, and an insulating layer 150. A channel 160 penetrates the passivation layer 120, the planarization layer 130, and the conductive layer 140 to achieve electrical insulation of the display area AA and the non-display area NA of the display panel. Ideally, the insulating layer 150 only covers the display area AA of the display panel, thereby guiding the conductive layer 140 of the non-display area NA through the silver dots and realizing electrical functions of the non-display area NA, such as electrostatic extraction, lead interface, and the like.

Figure 2:
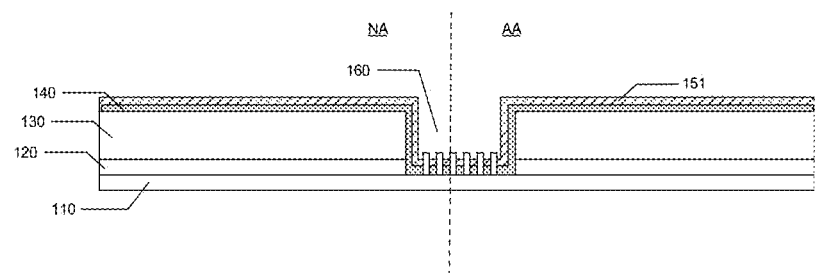
FIG. 2 is a partial cross-sectional view of a display panel in the prior art.

However, referring to FIG. 2, in practice, a width of the non-display area NA becomes smaller and smaller. Because the printing precision of the polyimide cannot be accurately controlled, the insulating layer 150 is easily expanded to cover the conductive layer 150 located in the non-display area NA, result that the silver dots cannot be electrically connected to the non-display area NA, causing the display panel to work abnormally.

In order to solve the above problems, the present application provides a display panel and a method of fabricating thereof to solve the technical problem that the silver dots cannot be electrically connected to the non-display area NA.

Referring to FIG. 3 to FIG. 6, the present application provides a display panel including a display area AA, a non-display area NA, and a channel 260 that isolates the display area AA and the non-display area NA.

Figure 3:
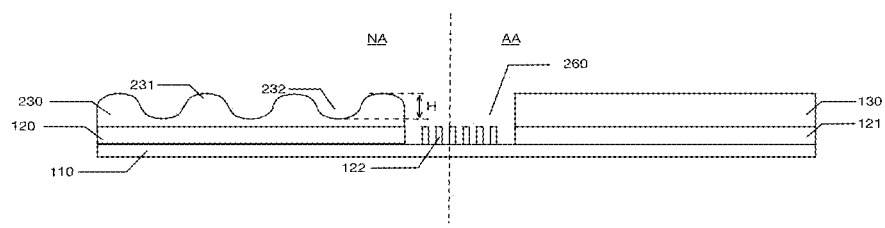
FIG. 3 is a cross-sectional view of a display panel after forming a second insulating layer in an embodiment of the present application.

Referring to FIG. 3, the display panel further includes a thin film transistor layer 110 including a first region and a second region surrounding the first region. The display area AA is disposed on the first region, the non-display area NA is disposed on the second region, and the channel 260 is disposed on a boundary of the first region and the second region.

Figure 4:
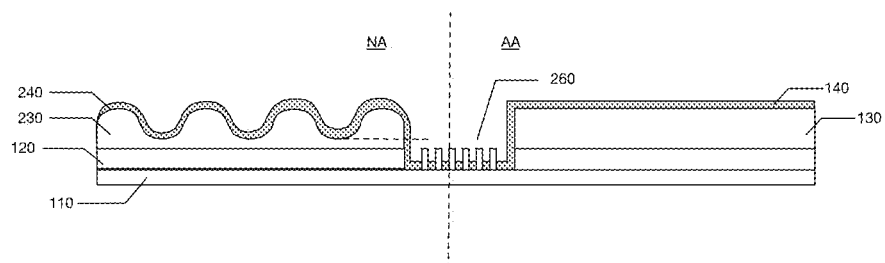
FIG. 4 is a cross-sectional view of the display panel after forming a first conductive layer in a specific embodiment of the present application.
Figure 7:
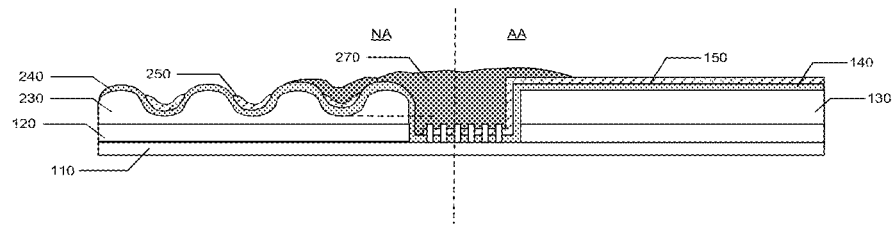
FIG. 7 is a cross-sectional view of the display panel after forming silver dots in a specific embodiment of the present application.

Referring to FIG. 3, FIG. 4 and FIG. 7, the non-display area NA includes a first insulating layer 120, a second insulating layer 230, a first conductive layer 240, and a third insulating layer 250. The second insulating layer 230 covering the first insulating layer 120, a surface of the second insulating layer 230 has a plurality of convex portions 231 and a plurality of concave portions 232 that are continuously distributed, the convex portions 231 and concave portions 232 are alternately disposed. The first conductive layer 240 covering the second insulating layer 230, the first conductive layer 240 having a uniform thickness. The third insulating layer 250 comprising a plurality of insulating strips separating from each other on the first conductive layer 240, wherein the insulating strips are disposed corresponding to the concave portions 232. The display area AA includes a passivation layer 121, a planarization layer 130, a second conductive layer 140, and a fourth insulation layer 150. The structure of the display area AA is the same as that of the prior art, and details are not described herein again.

Referring to FIG. 3, in the present application, the display panel further includes a plurality of isolation portions 122 located in the channel 260. The plurality of isolation portions 122 are the same height as the first insulating layer 120 and the passivation layer 121, and are evenly distributed in the channel 260. The height of the plurality of isolation portions 122 is greater than a distance between two adjacent isolation portions 122. The first conductive layer 240 and the second conductive layer 140 are simultaneously formed using a same mask. Such an arrangement can break a continuity between the first conductive layer 240 and the second conductive layer 140, achieving electrical isolation of the display area and the non-display area.

In this embodiment, a projection of each concave portion 232 on a light-emitting surface of the display panel covers a projection of the insulating strip corresponding to the concave portion 232 on the light-emitting surface of the display panel. That is, the insulating strip is confined in the recess 232 to prevent the insulator from covering the first conductive layer.

Figure 5:
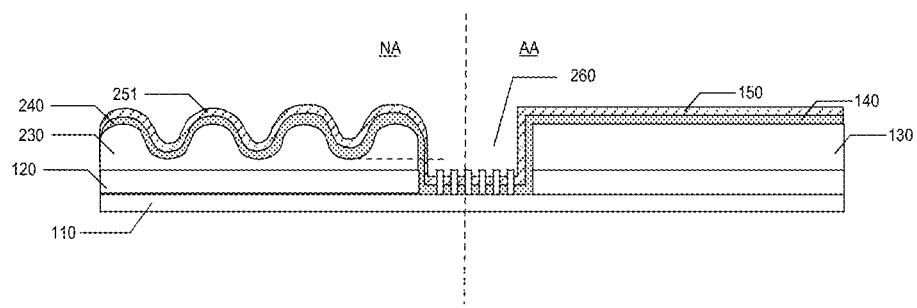
FIG. 5 is a cross-sectional view of the display panel after forming an insulating dielectric layer in an embodiment of the present application.
Figure 6:
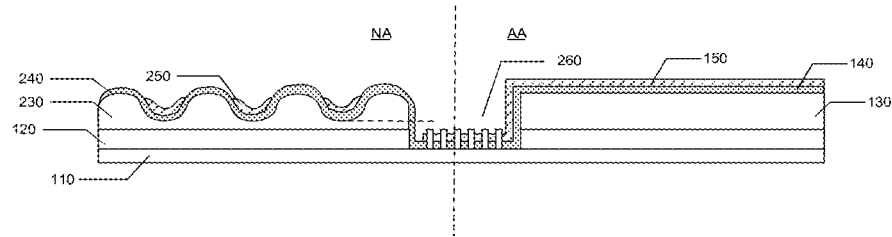
FIG. 6 is a cross-sectional view of the display panel after forming a third dielectric layer in a specific embodiment of the present application.

Referring to FIG. 5 and FIG. 6, in the present application, the material forming the third insulating layer 250 is polyimide. The polyimide has a curing concentration of less than 6.5% and a viscosity of less than 35%. The flowable polyimide can be actively polymerized in the plurality of concave portions 232 under neutral action to expose the first conductive layer above the plurality of convex portions 231.

In this embodiment, a side wall of any one of the convex portions 231 and a side wall of the concave portion 232 corresponding to the convex portion 231 are smoothly connected. The smoothly connected sidewalls facilitate flow polymerization of the polyimide into the plurality of concave portions 232 from top to bottom. In this embodiment, the convex portions 231 have same shape and size, and the concave portions 232 have same shape and size.

In this embodiment, a distance H between a highest point of the convex portions 231 and a lowest point of the concave portions 232 is greater than or equal to five times a thickness of the insulating strip. Such an arrangement ensures that the polyimide carrying the insulating strip is completely polymerized in the concave portions 232, ensures that the third insulating layer 250 does not completely shield the first conductive layer 240. Meanwhile, in order to promote polymerization of the polyimide in the concave portions 232, tops of the convex portions 231 are smooth curved surfaces.

Referring to FIG. 7, the display panel further including a plurality of silver dots 270 separately distributed in the channel 260. Tops of the silver dots 270 overflow the channel 260 and extend to cover the first conductive layer 240 of the non-display area NA.

Compared with the non-display area with a flat surface in the prior art, the non-display area of the display panel provided by the present application has a plurality of convex portions and a plurality of concave portions continuously distributed. The convex portions and concave portions are alternately disposed. Therefore, the present application can define a third insulating layer covering the first conductive layer of the non-display area in the concave portions and exposing the first conductive layer outside the third insulating layer, so that electrical connection between the first conductive layer and the silver dots can be achieved. The present application solves the technical problem that the silver dots cannot be electrically connected to the non-display area in the prior art.

Correspondingly, the present application also provides a method of fabricating a display panel, which will be described in detail below with reference to the accompanying drawings.

Referring to FIG. 3, a thin film transistor layer 110 is provided, the thin film transistor layer 110 including a first region and a second region surrounding the first region. Forming a first insulating layer 120 covering the first region and a passivation layer 121 covering the second region, and providing a channel 260 between the first insulating layer 120 and the passivation layer. Thereafter, forming a second insulating layer 230 covering the first insulating layer 120 and a planarization layer 130 covering the passivation layer 121, wherein a surface of the second insulating layer 230 has a plurality of convex portions 231 and a plurality of concave portions 232 continuously distributed, and the convex portions 231 and the concave portions 232 are alternately disposed.

Referring to FIG. 4, forming a first conductive layer 240 covering the second insulating layer 230 and a second conductive layer 140 covering the planarization layer 130, the first conductive layer 240 having a uniform thickness.

Referring to FIG. 5 and FIG. 6, forming a third insulating layer 250 and a fourth insulating layer 150, wherein the third insulating layer 250 comprises a plurality of insulating strips separating from each other on the first conductive layer 240, and the insulating strips are disposed corresponding to the concave portions 232, and the fourth insulating layer 150 covers the second conductive layer 140.

In this embodiment, the method of forming the second insulating layer 230 covering the first insulating layer 120 and the planarization layer covering the passivation layer includes the following steps.

Forming an insulating dielectric layer covering the first insulating layer 120, the channel 260, and the passivation layer 121. Then forming a photoresist covering the insulating dielectric layer, and developing the photoresist using a mask. Then transferring a pattern of the photoresist onto the insulating dielectric layer. The mask includes a first pattern corresponding to the planarization layer 130, a second pattern corresponding to the channel 260, and a third pattern corresponding to the second insulating layer 230. In the present application, a region of the mask corresponding to the third pattern is a halftone mask, an image corresponding to the plurality of concave portions 232 in the halftone mask has a first light transmittance, an image corresponding to the convex portions 231 has a second light transmittance, and the first light transmittance is greater than the second light transmittance.

In this embodiment, the method of forming the third insulating layer 250 and the fourth insulating layer includes the following steps. Providing polyimide covering the first conductive layer 240 and the second conductive layer, the polyimide having fluidity. Then positioning the display panel to collect the polyimide on the first conductive layer 240 into the concave portions 232. Then curing the polyimide to form a plurality of insulating stripes at a bottom of the concave portions 232 and a fourth insulating layer 150 covering the second conductive layer 140. In the present embodiment, in order to impart good fluidity to the insulating dielectric layer, the polyimide has a curing concentration of less than 6.5% and a viscosity of less than 35%. But it is not limited to this.

In the present application, a projection of each concave portion 232 on a light-emitting surface of the display panel covers a projection of the insulating strip corresponding to the concave portion 232 on the light-emitting surface of the display panel. A side wall of any one of the convex portions 231 and a side wall of the concave portion 232 corresponding to the convex portion 231 are smoothly connected. The convex portions 231 have same shape and size, and the concave portions 232 have same shape and size. A distance between a highest point of the convex portions 231 and a lowest point of the concave portions 232 is greater than or equal to five times a thickness of the insulating strip. Tops of the convex portions 231 are smooth curved surfaces.

Referring to FIG. 7, after the third insulating layer 250 and the fourth insulating layer 150 are formed, the method further includes forming a plurality of silver dots 270 separately distributed in the channel 260. Wherein tops of the silver dots 270 overflow the channel 260 and extend to cover the first conductive layer 240 of the non-display area NA.

Compared with the non-display area with a flat surface in the prior art, the non-display area of the display panel provided by the present application has a plurality of convex portions and a plurality of concave portions continuously distributed. The convex portions and concave portions are alternately disposed. Therefore, the present application can define a third insulating layer covering the first conductive layer of the non-display area in the concave portions and exposing the first conductive layer outside the third insulating layer, so that electrical connection between the first conductive layer and the silver dots can be achieved. The present application solves the technical problem that the silver dots cannot be electrically connected to the non-display area in the prior art.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A display panel comprising a display area, a non-display area, and a channel separating the display area and the non-display area, wherein the non-display area comprises:
    a first insulating layer;
    a second insulating layer covering the first insulating layer, wherein a surface of the second insulating layer has a plurality of convex portions and a plurality of concave portions that are continuously distributed, the plurality of convex portions and the plurality of concave portions are alternately disposed;
    a first conductive layer covering the second insulating layer, the first conductive layer having a uniform thickness; and
    a third insulating layer comprising a plurality of insulating strips separated from each other on the first conductive layer, wherein the insulating strips are disposed corresponding to the plurality of concave portions.

2. The display panel according to claim 1, further comprising a plurality of silver dots separately distributed in the channel;
    wherein tops of the silver dots overflow the channel and extend to cover the first conductive layer of the non-display area.

3. The display panel according to claim 1, wherein a projection of each of the concave portions on a light-emitting surface of the display panel covers a projection of each of the insulating strips corresponding to the concave portions on the light-emitting surface of the display panel.

4. The display panel according to claim 1, wherein a side wall of any one of the plurality of convex portions and a side wall of one of the concave portions corresponding to the convex portion are smoothly connected.

5. The display panel according to claim 1, wherein the plurality of convex portions have a same shape and size, and the plurality of concave portions have a same shape and size.

6. The display panel according to claim 5, wherein a distance between a highest point of the plurality of convex portions and a lowest point of the plurality of concave portions is greater than or equal to five times a thickness of the insulating strips.

7. The display panel according to claim 1, wherein tops of the plurality of convex portions are smooth curved surfaces.

8. The display panel according to claim 1, wherein material of the third insulating layer is polyimide; and
    wherein the polyimide has a curing concentration of less than 6.5% and a viscosity of less than 35%.

9. The display panel according to claim 1, further comprising a thin film transistor layer comprising a first region and a second region surrounding the first region;
    wherein the display area is disposed on the first region, the non-display area is disposed on the second region, and the channel is disposed on a boundary of the first region and the second region.

10. A method of fabricating a display panel, wherein the method comprises the steps of:
  providing a thin film transistor layer having a first region and a second region surrounding the first region;
  forming a first insulating layer covering the first region and a passivation layer covering the second region, and providing a channel between the first insulating layer and the passivation layer;
  forming a second insulating layer covering the first insulating layer and a planarization layer covering the passivation layer, wherein a surface of the second insulating layer has a plurality of convex portions and a plurality of concave portions continuously distributed, and the plurality of convex portions and the plurality of concave portions are alternately disposed;
  forming a first conductive layer covering the second insulating layer and a second conductive layer covering the planarization layer, the first conductive layer having a uniform thickness; and
  forming a third insulating layer and a fourth insulating layer, wherein the third insulating layer comprises a plurality of insulating strips separated from each other on the first conductive layer, and the insulating strips are disposed corresponding to the plurality of concave portions, and the fourth insulating layer covers the second conductive layer.

11. The method of fabricating a display panel according to claim 10, wherein the method of forming the second insulating layer covering the first insulating layer and the planarization layer covering the passivation layer comprises:
  forming an insulating dielectric layer covering the first insulating layer, the channel, and the passivation layer;
  forming a photoresist covering the insulating dielectric layer;
  developing the photoresist using a mask; and
  transferring a pattern of the photoresist onto the insulating dielectric layer;
  wherein the mask comprises a first pattern corresponding to the planarization layer, a second pattern corresponding to the channel, and a third pattern corresponding to the second insulating layer;
  wherein a region of the mask corresponding to the third pattern is a halftone mask, an image corresponding to the plurality of concave portions in the halftone mask has a first light transmittance, an image corresponding to the plurality of convex portions has a second light transmittance, and the first light transmittance is greater than the second light transmittance.

12. The method of manufacturing a display panel according to claim 11, wherein the method of forming the third insulating layer and the fourth insulating layer comprises:
  providing polyimide covering the first conductive layer and the second conductive layer, the polyimide having fluidity;
  positioning the display panel to collect the polyimide on the first conductive layer into the plurality of concave portions;
  curing the polyimide to form a plurality of insulating stripes at a bottom of the plurality of concave portions and a fourth insulating layer covering the second conductive layer.

13. The method of manufacturing a display panel according to claim 12, wherein the polyimide has a curing concentration of less than 6.5% and a viscosity of less than 35%.

14. The method of manufacturing a display panel according to claim 12, wherein a projection of each of the concave portions on a light-emitting surface of the display panel covers a projection of the insulating strips corresponding to the concave portions on the light-emitting surface of the display panel.

15. The method of manufacturing a display panel according to claim 12, wherein a side wall of any one of the plurality of convex portions and a side wall of one of the concave portions corresponding to the convex portion are smoothly connected.

16. The method of manufacturing a display panel according to claim 12, wherein the plurality of convex portions have a same shape and size, and the plurality of concave portions have a same shape and size.

17. The method of manufacturing a display panel according to claim 12, wherein a distance between a highest point of the plurality of convex portions and a lowest point of the plurality of concave portions is greater than or equal to five times a thickness of the insulating strip.

18. The method of manufacturing a display panel according to claim 12, wherein tops of the plurality of convex portions are smooth curved surfaces.

19. The method of manufacturing a display panel according to claim 12, wherein after the third insulating layer and the fourth insulating layer are formed, the method further comprises:
  forming a plurality of silver dots separately distributed in the channel;
  wherein tops of the silver dots overflow the channel and extend to cover the first conductive layer of the non-display area.

* * * * *